United States Patent [19]

Salasoo et al.

[11] Patent Number: 5,512,870
[45] Date of Patent: Apr. 30, 1996

[54] SUPERCONDUCTING SWITCH

[75] Inventors: Lembit Salasoo; Evangelos T. Laskaris, both of Schenectady; Richard A. Ranze, Scotia, all of N.Y.

[73] Assignee: General Electric Company, Schenectady, N.Y.

[21] Appl. No.: 514,331

[22] Filed: Aug. 11, 1995

[51] Int. Cl.⁶ ........................................ H01F 6/06
[52] U.S. Cl. .................... 335/216; 505/879; 338/32 S
[58] Field of Search ...................... 335/216, 299; 336/DIG. 1; 338/32 S; 361/19, 141; 505/879, 850, 880

[56] References Cited

U.S. PATENT DOCUMENTS

| | | | |
|---|---|---|---|
| 4,528,532 | 7/1985 | Keim | 335/216 |
| 4,586,017 | 4/1986 | Laskaris et al. | 338/325 |
| 4,803,456 | 2/1989 | Benesch | 338/32 S |
| 4,904,970 | 2/1990 | Srivastava | 335/216 |
| 5,361,055 | 11/1994 | Peck | 335/216 |
| 5,410,288 | 4/1995 | Dorri et al. | 335/216 |

*Primary Examiner*—Leo P. Picard
*Assistant Examiner*—Raymond M. Barrera
*Attorney, Agent, or Firm*—Douglas E. Erickson; Paul R. Webb, II

[57] ABSTRACT

A superconductive switch has a first layer of a superconductive coil wire wound around a shaft clockwise from the first end to the middle and counterclockwise from the middle to the second end. A second layer of the wire is wound around the first layer in identical fashion. A third layer of the wire is wound around the second layer counterclockwise from the first end to the middle and clockwise from the middle to the second end. An electrical heater is located between the first and second layers, and a stratum of electrical insulation, discrete from that of the coil wire, is located between the second and third layers.

10 Claims, 2 Drawing Sheets

5,512,870

SUPERCONDUCTING SWITCH

BACKGROUND OF THE INVENTION

The present invention relates generally to superconductive devices and more particularly to a superconductive switch useful in the operation of a superconductive device.

Superconducting devices have a main superconductive coil assemblage and include, but are not limited to, magnetic resonance imaging (MRI) systems for medical diagnosis, superconductive rotors for electric generators and motors, and magnetic levitation devices for train transportation. Superconductive devices usually employ a superconductive switch to transfer between a persistent superconducting operating mode and a non-persistent superconducting operating mode. Typically a superconductive switch is used to start up superconductive operation of the superconductive device and to purposely run down such superconductive operation.

Known superconductive switches are placed in a cryogenic region of the superconductive device where the operating temperature is less than or equal to the critical temperature of the superconductor material used in the main superconductive coil assemblage of the superconductive device. Such a superconductive switch typically has a superconductive coil portion and an electrical heater portion. The coil wire of the superconductive coil portion is wound in a two-in-hand bifilar manner (i.e., adjacent turns in the same layer of coil wire, or the turns in adjacent layers of coil wire, are wound alternately clockwise and counterclockwise as one travels along and between the two ends of the coil wire) for low inductance and has a heavy grade of electrical insulation for adequate voltage standoff capability to meet the switch's design peak terminal voltage. Activation of the electrical heater portion raises the temperature in the superconductive coil portion above the critical temperature.

Quench protection techniques for superconductive devices include techniques for preventing (or delaying) an impending quench and techniques for preventing (or limiting) harm to the superconductive device that is undergoing a quench. Such harm is from damaging high temperatures and high stresses applied locally to the magnet at the quench site. Known techniques for preventing (or limiting) such harm seek to avoid excessive localized heat energy deposition in the superconducting winding and include using a quench-detection signal (from the electrical center of the main superconductive coil assemblage of the superconductive device) directly supplying an energy dump resistor or directly powering a wide-area electrical heater located near the main superconductive coil assemblage of the superconductive device. Such known techniques take a relatively long time to work.

SUMMARY OF THE INVENTION

It is an object of the invention to provide a high-voltage, low-inductance superconductive switch useful, for example, to quickly energize an energy dump resistor to protect a superconductive device from harm during a quench.

The superconductive switch of the invention includes: a coil form; first, second, and third layers of an electrically-insulated, stabilized superconductive coil wire; a first electrically-insulated, electrical heater; and a first stratum of electrical insulation. The coil form includes a generally cylindrical shaft having a generally longitudinally extending axis, first and second ends, a middle located generally equidistant from the ends, and clockwise and counterclockwise directions about the axis around the shaft. The first layer of the coil wire is circumferentially wound around the shaft in the clockwise direction from the first end to the middle and in the counterclockwise direction from the middle to the second end. The second layer of the coil wire is circumferentially wound around the first layer in the clockwise direction from the first end to the middle and in the counterclockwise direction from the middle to the second end. The third layer of the coil wire is circumferentially wound around the second layer in the counterclockwise direction form the first end to the middle and in the clockwise direction from the middle to the second end. The first electrical heater is located between the first and second layers, and the first stratum of electrical insulation is separate from that of the coil wire and is located between the second and third layers.

Several benefits and advantages are derived from the invention. The switch's coil winding pattern together with the first stratum of electrical insulation attains a desired voltage standoff capability for the switch without the need for heavy electrical insulation of the coil wire. The lighter electrical insulation used for the electrically-insulated coil wire does not compromise switch thermal conduction and quench propagation when the switch is used, for example, to quickly de-energize the main superconductive coil assemblage of a superconducting device by quickly energizing an energy dump resistor to protect the superconductive device from harm during a quench.

BRIEF DESCRIPTION OF THE DRAWINGS

The accompanying drawings illustrate a preferred embodiment of the present invention wherein.

DETAILED DESCRIPTION OF THE INVENTION

Figure 2:
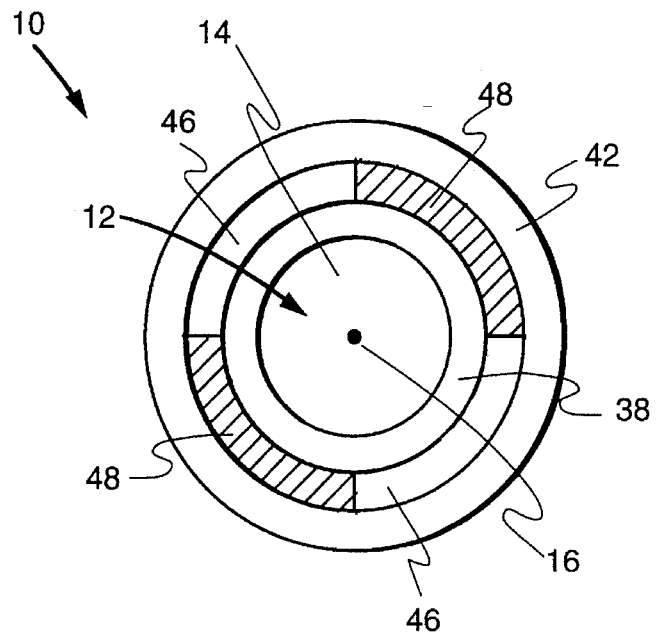
FIG. 2 is a sectional view of a portion of the superconductive switch of FIG. 1 taken along lines 2—2 of FIG. 1.
Figure 1:
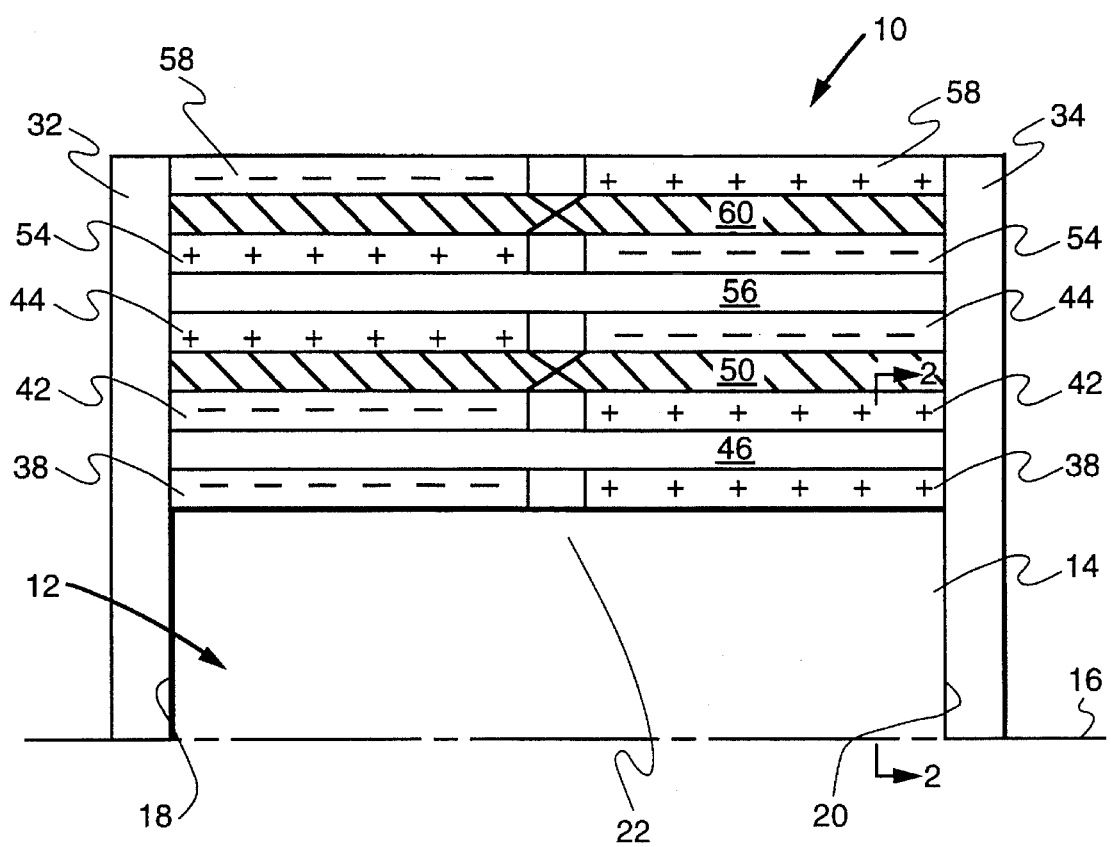
FIG. 1 is a schematic cross-sectional view of the top-half of a fully-wound superconductive switch of the present invention which has been cut by a plane containing the longitudinal axis of the switch.
Figure 3:
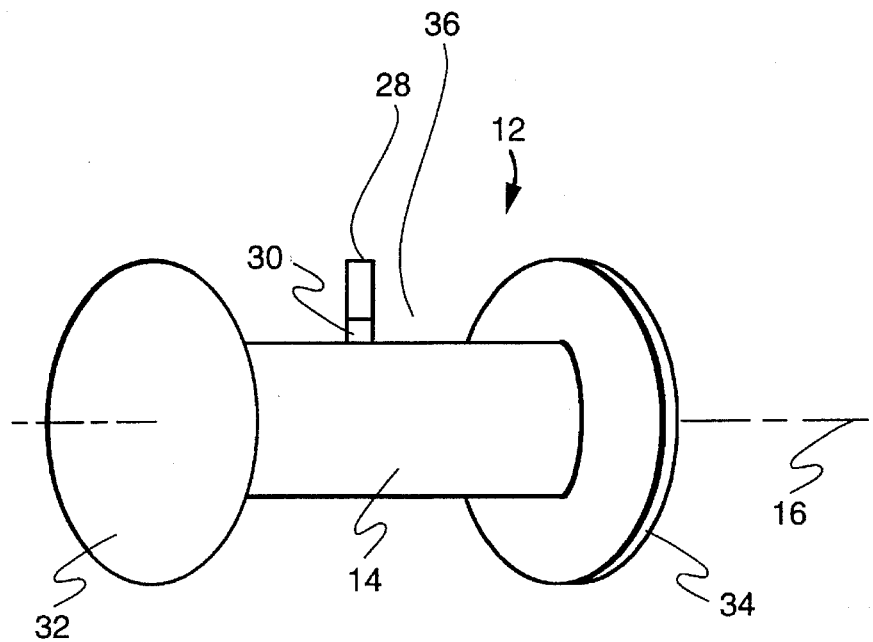
FIG. 3 is a schematic view of the coil form of the superconductive switch of FIG. 1.
Figure 4:
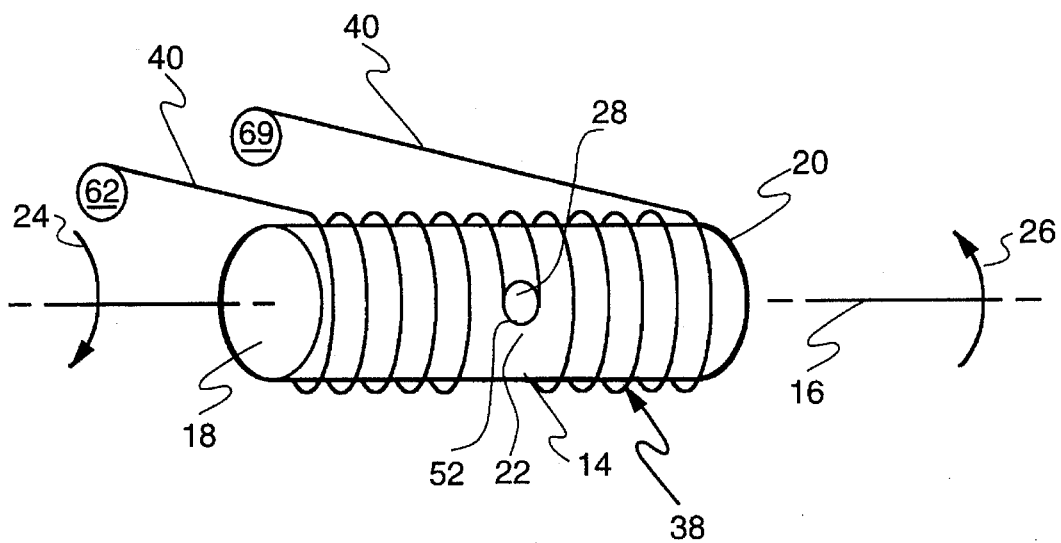
FIG. 4 is a schematic view of the coil form of FIG. 3 (with the two circular flanges removed from the coil form for clarity) together with two supply spools containing the coil wire used in the switch and with a first layer of coil wire shown wound around the shaft of the coil form.

Referring now to the drawings, FIGS. 1 and 2 show a preferred embodiment of the superconductive switch 10 of the present invention. The superconductive switch 10 includes a coil form 12 which is also shown in FIG. 3. The coil form 12 includes a generally cylindrical shaft 14 which is also shown in FIG. 4. The shaft 14 has a generally longitudinally extending axis 16, first and second ends 18 and 20, a middle 22 disposed generally equidistant from the ends 18 and 20, and clockwise and counterclockwise directions 24 and 26 about the axis 16 around the shaft 14. Preferably, the coil form 12 also includes a radially extending pin 28 attached to the shaft 14 generally at the middle 22, and the pin 28 includes a groove 30. In an exemplary embodiment, the coil form 12 also includes two generally circular flanges 32 and 34 each attached to a corresponding one of the ends 18 and 20 to define a spool having a generally annularly cylindrical space 36 longitudinally between the flanges 32 and 34 and radially outward of the shaft 14. In a preferred choice of materials, the coil form 12 comprises fiberglass. The entire coil form 12 may be of monolithic construction, or the circular flanges 32 and 34 and/or the pin 28 may be discrete parts attached to the shaft 14. The pin 28 is made of electrically insulating material, and more than one pin 28 (including circumferentially spaced apart and/or longitudinally adjacent pins attached to the shaft 14 generally at the middle 22) and/or more than one groove 30 may be used in particular applications.

The superconductive switch 10 also includes a first layer 38 of an electrically-insulated, stabilized superconductive coil wire 40 circumferentially wound around the shaft 14 in the clockwise direction 24 from the first end 18 to the middle 22 and in the counterclockwise direction 26 from the middle to the second end 20. FIG. 4 shows the individual turns of the coil wire 40 in the first layer 38, such individual turns being omitted from the first layer 38 in FIG. 1 for clarity and replaced by "−" signs in the first layer 38 of FIG. 1 representing turns wound in the clockwise direction 24 and by "+" signs in the first layer 38 of FIG. 1 representing turns wound in the counterclockwise direction 26. It is noted that electrically-insulated, stabilized superconductive coil wire is commercially available, and that, for the purpose of describing the present invention, a superconductive tape is considered to be a superconductive wire.

The superconductive switch 10 additionally includes a second layer 42 of the coil wire 40 circumferentially wound around the first layer 38 in the clockwise direction 24 (indicated by the "−" signs in the second layer 42 in FIG. 1) from the first end 18 to the middle 22 and in the counterclockwise direction 26 (indicated by the "+" signs in the second layer 42 in FIG. 1) from the middle 22 to the second end 20. The superconductive switch 10 further includes a third layer 44 of the coil wire 40 circumferentially wound around the second layer 42 in the counterclockwise direction 26 (indicated by the "+" signs in the third layer 44 in FIG. 1) from the first end 18 to the middle 22 and in the clockwise direction 24 (indicated by the "−" signs in the third layer 44 in FIG. 1) from the middle 22 to the second end 20. It is noted that the first, second, and third layers 38, 42, and 44 are layers wound from the same physical coil wire 40, and that the coil wire 40 may be a monolithic piece of coil wire or may be two or more discrete pieces of spliced-together coil wire.

The superconductive switch 10 moreover includes a first electrically-insulated, electrical heater 46 disposed between the first and second layers 38 and 42. Although the first layer 38 is shown directly contacting the shaft 14 in FIG. 1, the invention is not so limited, and there can be other wound layers of the coil wire between the first layer 38 and the shaft 12. In other words, the radially-inward layer closest to the first electrical heater 46 need not be the layer closest to the shaft 14. Electrically-insulated, electrical heaters are commercially available and are used in conventional superconductive switches. Preferably, the first electrical heater 46 is of the polyimide-insulated, etched-foil type and extends longitudinally between and generally to the ends 18 and 20. In an exemplary embodiment, the first electrical heater 46 extends circumferentially at least generally thirty degrees but less than a complete circle. In this construction, it is preferred that the superconductive switch 10 include at least one electrically-insulated, thermally-conductive metal strip 48 disposed between the first and second layers 38 and 42 (as seen in FIG. 4) and extending longitudinally between and generally to the ends 18 and 20 for quick and even heat transfer to the first and second layers 38 and 42. Preferably, the metal strip 48 is made of oxygen-free hard copper.

The superconductive switch 10 as well includes a first stratum of electrical insulation 50 discrete from that of the coil wire 40 and disposed between the second and third layers 42 and 44. Preferably, the superconductive switch 10 has a design peak terminal voltage, and the first stratum of electrical insulation 50 has a voltage standoff capability at least equal to the design peak terminal voltage. Although the first stratum of electrical insulation 50 is shown as the radially closest such stratum to the shaft 14 in FIG. 1, the invention is not so limited, and the first stratum of electrical insulation can be the radially furthest such stratum, or the first stratum of electrical insulation can be between the radially closest and furthest such strata. In an exemplary embodiment, the first stratum of electrical insulation 50 provides electrical insulation between the second and third layers 42 and 44 which is at least ten times better than the electrical insulation provided by the coil wire 40 itself. Preferably, the first stratum of electrical insulation 50 comprises fiberglass cloth and/or polyimide film. It is noted that fiberglass cloth will develop full voltage standoff capability only after post-winding resin impregnation, as is understood by those skilled in the art.

In a preferred construction, the first layer 38 includes a midportion 52 disposed generally equidistant from the ends 18 and 20 and looped around the pin 28. It is noted that the coil wire 40 makes a 180-degree hairpin bend around the pin 28. In an exemplary embodiment, the midportion 52 is disposed in the groove 30. Preferably, the first, second, and third layers 38, 42, and 44, the first electrical heater 46, and the first stratum of electrical insulation 50 are disposed in the space 36, such previously-defined space 36 being longitudinally between the flanges 32 and 34 and radially outward of the shaft 14, and such space 36 being shown empty in FIG. 3.

A particular application may call for a superconductive switch with additional buildup. Here, the superconductive switch 10 includes a fourth layer 54 of the coil wire 40 circumferentially wound around the third layer 44 in the counterclockwise direction 26 (indicated by the "+" signs in the fourth layer in FIG. 1) from the first end 18 to the middle 22 and in the clockwise direction 24 (indicated by the "−" signs in the fourth layer 54 in FIG. 1) from the middle 22 to the second end 20. A second electrically-insulated, electrical heater 56 is disposed between the third and fourth layers 44 and 54. The superconductive switch 10 includes a fifth layer 58 of the coil wire 40 circumferentially wound around the fourth layer 54 in the clockwise direction 24 (indicated by the "−" signs in the fifth layer 58 in FIG. 1) from the first end 18 to the middle 22 and in the counterclockwise direction 26 (indicated by the "+" signs in the fifth layer in FIG. 1) from the middle 22 to the second end 20. A second stratum of electrical insulation 60, discrete from that of the coil wire 40, is disposed between the fourth and fifth layers 54 and 58.

Referring to FIG. 4, a preferred method for making the superconductive switch 10 of the present invention includes winding one terminus of the coil wire 40 around a first supply spool 62 and winding the other terminus of the coil wire 40 around a second supply spool 64 leaving the midportion 52 of the coil wire 40 unwound and spaced between the two supply spools 62 and 64. The midportion 52 of the coil wire 40 then is looped around the pin 28. The shaft 14 then is rotated in the clockwise direction 24 and the coil wire 40 is guided such that a first segment of the coil wire 40 is paid out from the first supply spool 62 and wound around the shaft 14 generally from the middle 22 to the first end 18 of the shaft 14 and such that a first section of the coil wire 40 is paid out from the second supply spool 64 and wound around the shaft 14 generally from the middle 22 to the second end 20 of the shaft 14. Referring to FIG. 1, it is noted that the first segment is that portion of the first layer 38 having the "−" signs, and the first section is that portion of the first layer 38 having the "+" signs.

Then, the shaft 14 is continued to be rotated in the clockwise direction 24 and the coil wire 40 is guided such that a second segment of the coil wire 40 is paid out from the first supply spool 62 and wound around the first segment of the wound coil wire 40 generally from the first end 18 to the middle 22 of the shaft 14 and such that a second section of the coil wire 40 is paid out from the second supply spool 64 and wound around the first section of the wound coil wire 40 generally from the second end 20 to the middle 22 of the shaft 14. Referring to FIG. 1, it is noted that the second segment is that portion of the second layer 42 having the "−" signs, and the second section is that portion of the second layer 42 having the "+" signs.

Then, the coil wire 40 from the first supply spool 62 and the coil wire 40 from the second supply spool 64 are crossed over. It is noted that the pin 28 (and especially one of the grooves 30 in a multi-pin groove) can act as a crossover guide, and that a threaded pin 28 can be radially adjusted to locate one of its grooves 30 at a convenient radial height from the shaft 14 for the crossover. Next, the shaft 14 is continued to be rotated in the clockwise direction 24 and the coil wire 40 is guided such that a third segment of the coil wire 40 is paid out from the first supply spool 62 and wound around the second section of the wound coil wire 40 generally from the middle 22 to the second end 20 of the shaft 14 and such that a third section of the coil wire 40 is paid out from the second supply spool 64 and wound around the second segment of the wound coil wire 40 generally from the middle 22 to the first end 18 of the shaft 14. Referring to FIG. 1, it is noted that the third segment is that portion of the third layer 44 having the "−" signs, and the third section is that portion of the third layer 44 having the "+" signs.

Between the step of winding the first segment and first section and the step of winding the second segment and second section, there is included the step of disposing the first electrical heater 46 on the first segment and the first section. Between the step of winding the second segment and second section and the step of winding the third segment and third section, there is included the step of disposing the first stratum of electrical insulation 50 on the second segment and second section. Preferably, additional electrical insulation (not shown), such as polyimide insulating tape, discrete from that of the coil wire 40 and from that of the first stratum of electrical insulation 50, is disposed around the coil wire 40 generally at the crossover of the coil wire 40 from the first and second supply spools 62 and 64, as can be appreciated by those skilled in the art. The superconductive switch 10 can be further built-up in like fashion, if required, as is within the level of skill of the artisan and as shown in FIG. 1.

It is noted that the area between the second and third layers 42 and 44 and the area between the fourth and fifth layers 54 and 58 are areas of high operating voltage stress. The first and second strata of electrical insulation 50 and 60 are placed in such high operating voltage stress areas. Low voltage stress is experienced between adjacent winding turns of the coil wire 40 except at the crossovers where the previously-discussed additional electrical insulation is utilized. The area between the first and second layers 38 and 42 and the area between the third and fourth layers 44 and 54 are areas of low operating voltage stress. The first and second electrical heaters 46 and 56 are placed in such low operating voltage stress areas so as to concurrently quench the superconducting switch longitudinally and radially across the whole space 36 so that the slow quench propagation across the first and second strata of electrical insulation 50 and 60 is bypassed, and the superconductive switch 10 becomes resistive very quickly. Circumferential switch quench propagation will be quick since it is governed by the properties of the superconductor stabilizer in the coil wire 40.

The first and second electrical heaters 46 and 56 may be connected electrically in series and/or in parallel to produce an appropriate resistance to match the switch triggering source, and the heater leads (not shown in the figures) are brought out of the switch winding. The crossover region around the pins 28 can be packed with fiberglass to fill voids. At the end of the last layer (i.e., the fifth layer 58 in FIG. 1) of wound coil wire 40, the coil-wire leads (not shown in the figures) are brought out of the winding. An overwrap of fiberglass cloth, metallic wire or strip, and/or nonmetallic yarn can be wound over the last layer (i.e., the fifth layer 58 in FIG. 1) of wound coil wire 40, and then the whole superconductive switch 10 is impregnated with an epoxy or other polymer resin, wax, or other appropriate impregnant and thereafter cured.

The superconductive switch 10 of the present invention operates in the same manner as a conventional superconductive switch, but uses less electrical insulation in the coil wire. The invention provides a low-inductance superconductive switch where the voltage stress is no longer taken up by heavy turn-to turn electrical insulation (i.e., the heavy electrical insulation of the coil wire of a conventional superconductive switch), but by interlayer electrical insulation (i.e., the first and second strata of electrical insulation 50 and 60). As with a conventional superconductive switch, the superconductive switch 10 of the present invention is used by placing it in a cryogenic region where the temperature is at or below the critical temperature of the superconducting material used in the coil wire 40 of the superconductive switch 10. The coil wire 40 will be superconducting until the first and second electrical heaters 46 and 56 are activated and raise the temperature in the coil wire 40 of the superconductive switch 10 above the critical temperature at which time the coil wire 40 will be resistive. De-activating the electrical heaters 46 and 56 will lead to a return of superconductivity in the coil wire 40 of the superconductive switch 10. The superconductive switch 10 of the invention is ideal for use in a superconductive magnet quench protection system (not shown in the figures) using kilovolt-class voltages to de-energize the superconductive magnet as quickly as possible and with its low-inductance being used so that current transfers quickly out of the switch into a parallel dump resistor (not shown in the figures).

The foregoing description of several preferred embodiments of the invention has been presented for purposes of illustration. It is not intended to be exhaustive or to limit the invention to the precise form disclosed, and obviously many modifications and variations are possible in light of the above teaching. It is intended that the scope of the invention be defined by the claims appended hereto.

We claim:

1. A superconductive switch comprising:
   a) a coil form including a generally cylindrical shaft having a generally longitudinally extending axis, first and second ends, a middle disposed generally equidistant from said ends, and clockwise and counterclockwise directions about said axis around said shaft;

b) a first layer of an electrically-insulated, stabilized superconductive coil wire circumferentially wound around said shaft in said clockwise direction from said first end to said middle and in said counterclockwise direction from said middle to said second end;

c) a second layer of said coil wire circumferentially wound around said first layer in said clockwise direction from said first end to said middle and in said counterclockwise direction from said middle to said second end;

d) a third layer of said coil wire circumferentially wound around said second layer in said counterclockwise direction from said first end to said middle and in said clockwise direction from said middle to said second end;

e) a first electrically-insulated, electrical heater disposed between said first and second layers; and f) a first stratum of electrical insulation discrete from that of said coil wire and disposed between said second and third layers.

2. The superconductive switch of claim 1, wherein said coil form also includes a radially extending pin attached to said shaft generally at said middle and wherein said first layer includes a midportion disposed generally equidistant from said ends and looped around said pin.

3. The superconductive switch of claim 2, wherein said pin includes a groove and wherein said midportion is disposed in said groove.

4. The superconductive switch of claim 1, wherein said first electrical heater extends longitudinally between and generally to said ends.

5. The superconductive switch of claim 4, wherein said first electrical heater extends circumferentially at least generally thirty degrees but less than a complete circle, and also including at least one electrically-insulated, thermally-conductive metal strip disposed between said first and second layers and extending longitudinally between and generally to said ends.

6. The superconductive switch of claim 1, wherein said superconductive switch has a design peak terminal voltage and wherein said first stratum of electrical insulation has a voltage standoff capability at least equal to said design peak terminal voltage.

7. The superconductive switch of claim 6, wherein said first stratum of electrical insulation provides electrical insulation between said second and third layers which is at least ten times better than the electrical insulation provided by said coil wire itself.

8. The superconductive switch of claim 1, wherein said coil form also includes two generally circular flanges each attached to a corresponding one of said ends to define a spool having a generally annularly cylindrical space longitudinally between said flanges and radially outward of said shaft and wherein said first, second, and third layers, said first electrical heater, and said first stratum of electrical insulation are disposed in said space.

9. The superconductive switch of claim 1, also including:

g) a fourth layer of said coil wire circumferentially wound around said third layer in said counterclockwise direction from said first end to said middle and in said clockwise direction from said middle to said second end; and h) a second electrically-insulated, electrical heater disposed between said third and fourth layers.

10. The superconductive switch of claim 9, also including:

i) a fifth layer of a said coil wire circumferentially wound around said fourth layer in said clockwise direction from said first end to said middle and in said counterclockwise direction from said middle to said second end; and j) a second stratum of electrical insulation discrete from that of said coil wire and disposed between said fourth and fifth layers.

* * * * *